United States Patent
Terrovitis

(10) Patent No.: US 7,130,225 B1
(45) Date of Patent: Oct. 31, 2006

(54) CHARGE PUMP WITH LARGE BYPASS CAPACITORS

(75) Inventor: Manolis Terrovitis, Berkeley, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 264 days.

(21) Appl. No.: 10/836,709

(22) Filed: Apr. 29, 2004

Related U.S. Application Data

(60) Provisional application No. 60/550,000, filed on Mar. 3, 2004.

(51) Int. Cl.
*G11C 7/00* (2006.01)
*G11C 8/00* (2006.01)

(52) U.S. Cl. .......... 365/189.09; 327/157; 327/536; 327/537

(58) Field of Classification Search .......... 365/189.09, 365/60, 59; 327/157, 536, 537; 307/110; 363/59
See application file for complete search history.

(56) References Cited

U.S. PATENT DOCUMENTS 6,124,741 A * 9/2000 Arcus .......... 327/112
6,586,976 B1 * 7/2003 Yang .......... 327/157

* cited by examiner

*Primary Examiner*—Son T. Dinh
(74) *Attorney, Agent, or Firm*—Bever, Hoffman & Harms, LLP; Jeanette S. Harms

(57) ABSTRACT

A charge pump can advantageously include a PMOS transistor that functions as a first current source and an NMOS transistor that functions as a second current source. The transistors can be appropriately sized to provide low parasitic charge injection. Capacitors can function as low impedance voltage sources for rapidly turning on the PMOS and NMOS transistors, whereas switches can be used for quickly turning off the PMOS and NMOS transistors. The capacitors can be charged using a current mirror circuit, thereby facilitating the matching of currents of the transistors and ensuring low power consumption. Alternatively, an operational amplifier can be used in the charge pump to provide high output voltage range and superior current matching.

6 Claims, 5 Drawing Sheets

CHARGE PUMP WITH LARGE BYPASS CAPACITORS

RELATED APPLICATIONS

This application claims priority of U.S. Provisional Patent Application 60/550,000, entitled "System And Method For Communication" filed Mar. 3, 2004.

BACKGROUND OF THE INVENTION

1. Field of the Invention

The present invention relates to a charge pump and in particular to a charge pump that can provide matched currents, high output currents, low parasitic charge injection, high output voltage range, and low power consumption.

2. Description of the Related Art

Charge pumps can be used in many types of circuits, including, but not limited to, frequency synthesizers. Because of their ubiquitous use, designers are continually trying to improve charge pumps to more closely approximate the "ideal" charge pump. FIG. 1 illustrates an ideal charge pump 100 including two current sources 101A and 101B providing equal current as well as two switches 102A and 102B. Switch 102A, which is coupled to a high voltage supply, is controlled by a logic signal UP. In contrast, switch 102B, which is coupled to a low voltage supply, is controlled by a logic signal DN. Opening and closing of switches 102A/102B at predetermined intervals can generate a desired output current.

SUMMARY OF THE INVENTION

A charge pump in accordance with the present invention can advantageously provide matched currents, high output currents, low parasitic charge injection, high output voltage range, and low power consumption. In accordance with one feature of this charge pump, a PMOS transistor can function as a first current source and an NMOS transistor can function as a second current source. These transistors can be appropriately sized to provide low parasitic charge injection. The source of the PMOS transistor can be connected to a more positive or high voltage source, whereas the source of the NMOS transistor can be connected to a more negative or low voltage source. The drains of the NMOS and PMOS transistors can be connected.

Advantageously, capacitors can function as low impedance voltage sources for rapidly turning on the PMOS and NMOS transistors. For example, a first capacitor can be connected to the high voltage source and selectively connected to a gate of the PMOS transistor. A first bias generator can be used for charging this first capacitor. A second capacitor can be connected to the low voltage source and selectively connected to a gate of the NMOS transistor. A second bias generator can be used for charging the second capacitor. To rapidly turn off these transistors, switches can be used to selectively connect the gate of the PMOS transistor to the high supply voltage, and the gate of the NMOS transistor to the low supply voltage.

In one embodiment, the first and second bias generators can be implemented using a current mirror circuit, which can advantageously lower power consumption. This current mirror circuit can also advantageously match the currents of the PMOS and NMOS transistors. The current mirror circuit can include a mirrored PMOS transistor, a first mirrored NMOS transistor, a second mirrored NMOS transistor, and a bias current source.

In one embodiment, the mirrored PMOS transistor has a source connected to the high supply voltage and a gate and drain connected to the first capacitor. The first mirrored NMOS transistor has a source connected to the low supply voltage and a gate connected to the second capacitor. The second mirrored NMOS transistor has a source connected to the low supply voltage and a gate connected to the gate of the first mirrored NMOS transistor. The bias current source can be connected between the high voltage source and a drain of the second mirrored NMOS transistor. Additionally, the gate and drain of the second mirrored NMOS transistor are connected, and the drains of the mirrored PMOS transistor and the first mirrored NMOS transistor are connected.

In another embodiment, the charge pump can further include an operational amplifier to provide high output voltage range. Specifically, this operational amplifier can advantageously adjust the current of the PMOS transistor and ensure proper operation of the charge pump even when a control voltage is very high or very low. The operational amplifier also serves to provide a very accurate replica of currents in the bias components and currents sourced at the output of the charge pump. The operational amplifier can have a positive input terminal connected to the drains of the mirrored PMOS transistor and the first mirrored NMOS transistor, a negative input terminal connected to the drains of the PMOS transistor and the NMOS transistor, and an output terminal connected to the first capacitor. A method of designing a charge pump, which provides the above-described connections, is also described.

A method of designing a charge pump is also described. This method includes providing a PMOS transistor and an NMOS transistor as first and second current sources. Capacitive circuits can be provided for turning on the PMOS and NMOS transistors. Switches can be provided for turning off the PMOS and NMOS transistors.

A method of operating a charge pump is also described. This method includes using a PMOS transistor and an NMOS transistor as first and second current source. Capacitive circuits can be used for turning on the PMOS and NMOS transistors. Switches can be used for turning off the PMOS and NMOS transistors.

DETAILED DESCRIPTION OF THE FIGURES

Figure 1:
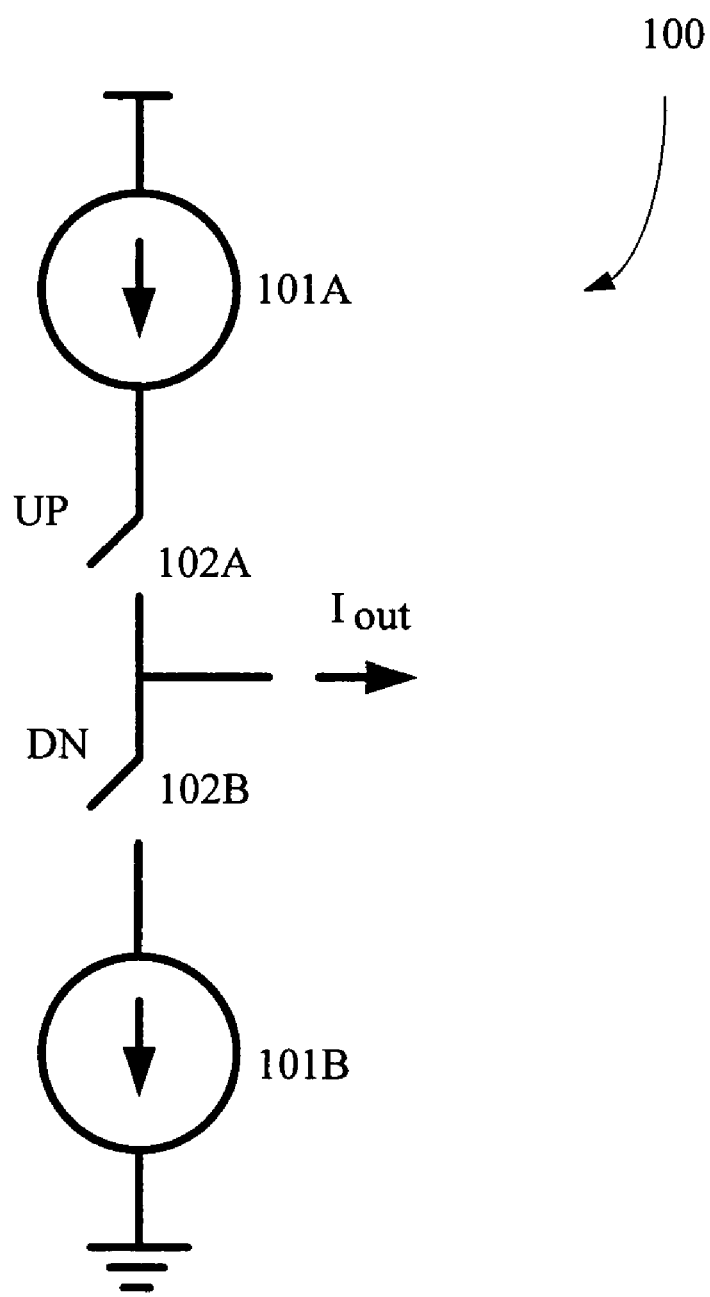
FIG. 1 illustrates an ideal charge pump including two current sources providing equal current.
Figure 2:
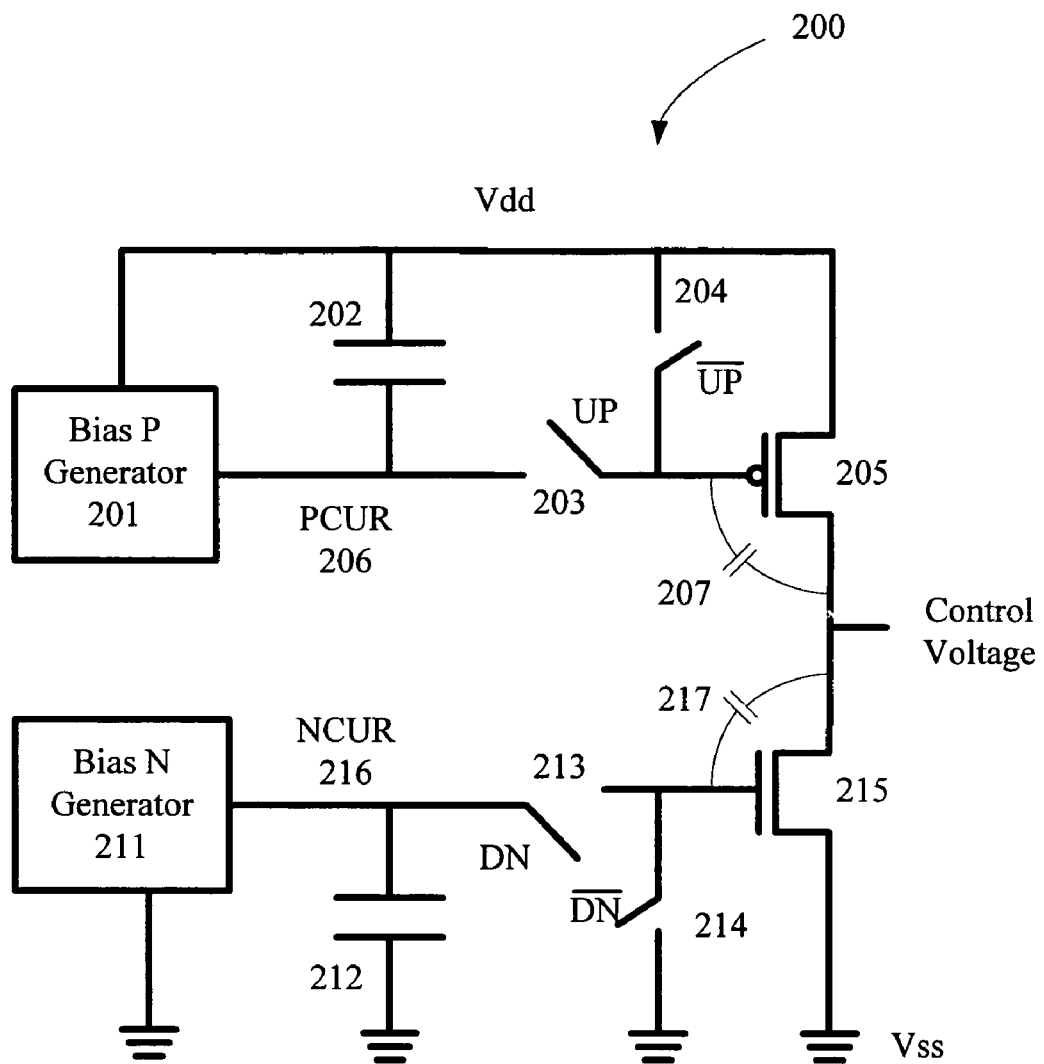
FIG. 2 illustrates an exemplary charge pump using NMOS and PMOS transistors for current sources and capacitors for providing a rapid turn on voltage to the transistors.

FIG. 2 illustrates an exemplary charge pump 200 in which the current sources can be rapidly switched off and on. In charge pump 200, PMOS transistor 205 and NMOS transistor 215 can function as these current sources.

Transistors 205 and 215 can be quickly turned off by connecting their gates to an appropriate voltage source.

For example, PMOS transistor 205 can be quickly turned off by connecting its gate to a high voltage source Vdd (using a switch 204 controlled by a logic signal UP(bar)), whereas NMOS transistor 215 can be turned off by connecting its gate to a low voltage source Vss (using a switch 214 controlled by a logic signal DN (bar)).

Optimally, transistors 205 and 215 can also rapidly turn on, thereby generating currents having substantially a square waveform. To facilitate this rapid turn on, charge pump 200 further includes capacitors 202 and 212. In accordance with one feature of the invention, capacitors 202 and 212 are large bypass capacitors (in one embodiment having the same size), which are being charged by bias p generator 201 and bias n generator 202, respectively. Specifically, bias p generator 201 and bias n generator 211 provide the appropriate charging of capacitors 202 and 212 such that when switches 203 and 213 are closed, capacitors 202 and 212 can provide the appropriate voltage to the gates of transistors 205 and 215.

In accordance with one aspect of the invention, capacitors 202 and 212 can act as low impedance voltage sources during the switching event (i.e. the beginning of the UP or DN control signal). In this manner, capacitors 202 and 212 can ensure the fast turn on of transistors 205 and 215, respectively. This fast turn on is important for proper functionality of charge pump 200 as well as low spur generation and low noise contribution.

After the switching event (i.e. the end of the UP or DN control signals (or the beginning of the UP(bar) or DN(bar) control signals)), capacitors 202 and 212 are slightly discharged because of charge redistribution. At this point, bias p generator 201 and bias n generator 211 have substantially a reference period to once again fully charge capacitors 202 and 212. Note that without capacitors 202 and 212, bias p generator 201 and bias n generator 211 would need to provide a low DC impedance to generate the substantially square current waveform, which would translate to much higher power consumption.

To minimize charge injection to the sensitive control voltage node, the length of NMOS transistor 215 can be about 3 times the length of PMOS transistor 205 whereas their widths can be equal. Advantageously, because this sizing provides approximately equal gate-to-drain capacitance (Cgd) and equal gate-to-source voltage (Vgs) for transistors 205 and 215, the parasitic charge injected to the control voltage through the gate-to-drain capacitances 207/217 can advantageously cancel each other.

In charge pump 200, bias p generator 201 is connected to a high voltage source Vdd and a control line 206. Bias p generator 201 is connectable to the gate of PMOS transistor 205 via switch 203 and control line 206. As noted previously, switch 203 is controlled by signal UP. Capacitor 202 is connected between control line 206 and the high voltage source Vdd. Switch 204 is connected between the high voltage source Vdd and the gate of PMOS transistor 205. Switch 204 is controlled by signal UP(bar). Although FIG. 2 shows both switches 203 and 204 as being open, in actual operation of charge pump 200, only one of these switches is open at any time.

Bias n generator 211 is connected to a low voltage source Vss and a control line 216. Bias n generator 211 is connectable to the gate of NMOS transistor 215 via switch 213 and control line 216. As noted previously, switch 213 is controlled by signal DN. Capacitor 212 is connected between control line 216 and the low voltage source Vss. Switch 214 is connected between the low voltage source Vss and the gate of NMOS transistor 215. Switch 214 is controlled by signal DN(bar). Although FIG. 2 shows both switches 213 and 214 as being open, in actual operation of charge pump 200, only one of these switches is open at any time.

Matching the currents provided by transistors 205 and 215 is important for optimal performance of a charge pump. Therefore, in one embodiment, current mirrors can be used to facilitate providing the appropriate biases for control lines 206/216. For example, FIG. 3 illustrates an exemplary charge pump 300 that includes current mirrors.

In this embodiment, the source of a PMOS transistor 305 is connected to high voltage source Vdd, the drain of PMOS transistor 305 is connected to the drain of NMOS transistor 315B and to the gate of PMOS transistor 305 to form a diode connection, and the source of NMOS transistor 315B is connected to the low voltage source Vss. The gate of PMOS transistor 305 is connectable to the gate of PMOS transistor 205 via switch 203 and control line 206. The gate of NMOS transistor 315B is connectable to the gate of PMOS transistor 215 via switch 213 and control line 216. The source of an NMOS transistor 315A is connected to the low voltage source Vss, whereas the gate of NMOS transistor 315A is connected to its drain as well as to the gate of NMOS transistor 315B. A bias current source 320 is connected between the high voltage source Vdd and the drain of NMOS transistor 315A.

Thus, transistors 205 and 305 can form one current mirror whereas transistors 215, 315A, and 315B can be used to form another current mirror. Note that the mirrored transistors in different branches can be the same size (e.g. transistor 205 can be the same size as transistor 305), thereby ensuring proper mirroring. In this configuration, the voltage on control line 216 can be set by diode-connected transistor 315A, whereas the voltage on control line 206 can be set by transistors 305 and 315B.

Figure 3:
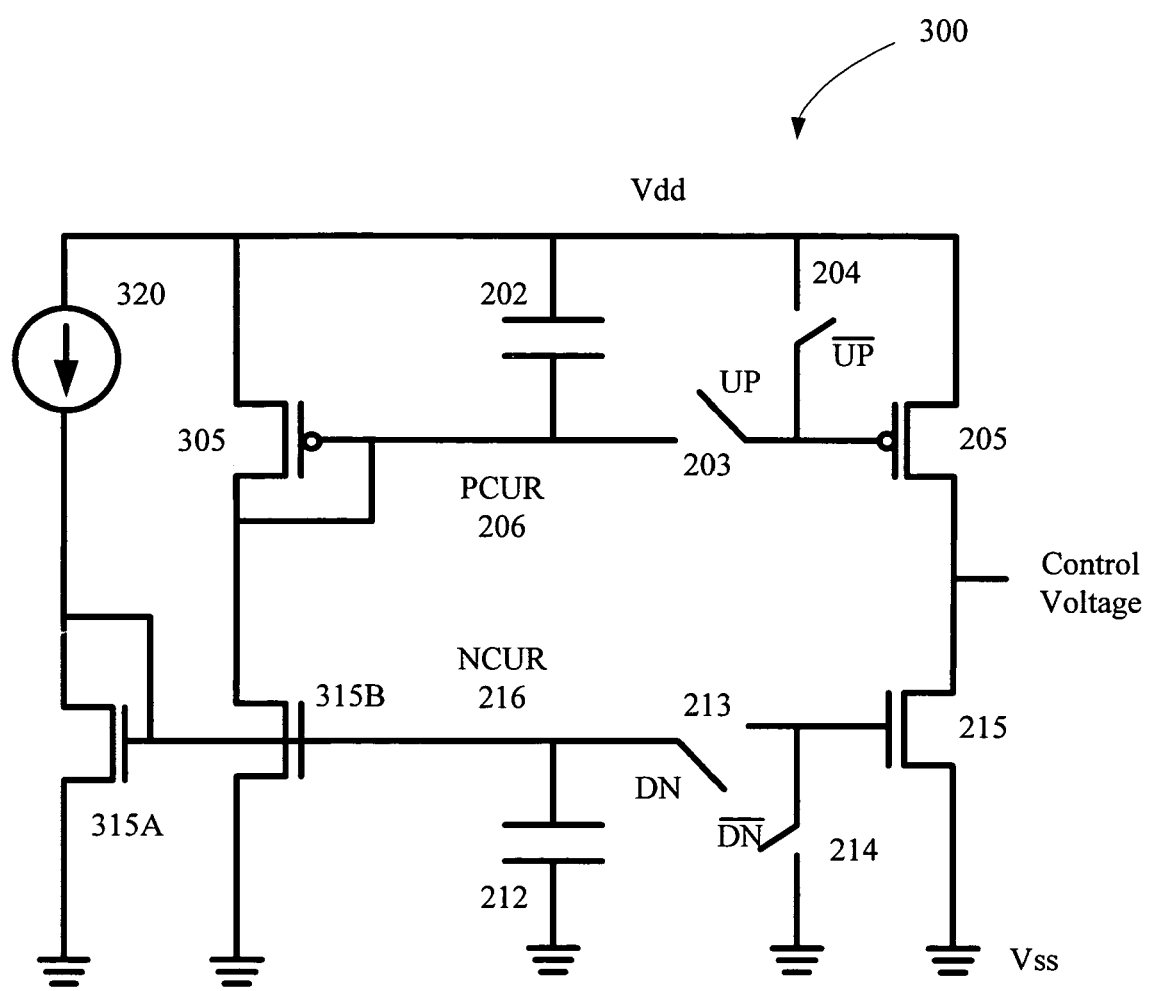
FIG. 3 illustrates another exemplary charge pump using NMOS and PMOS transistors for current sources and capacitors for providing a rapid turn on voltage to the transistors. Exemplary current mirrors can be used to match the currents provided by the current sources.
Figure 4:
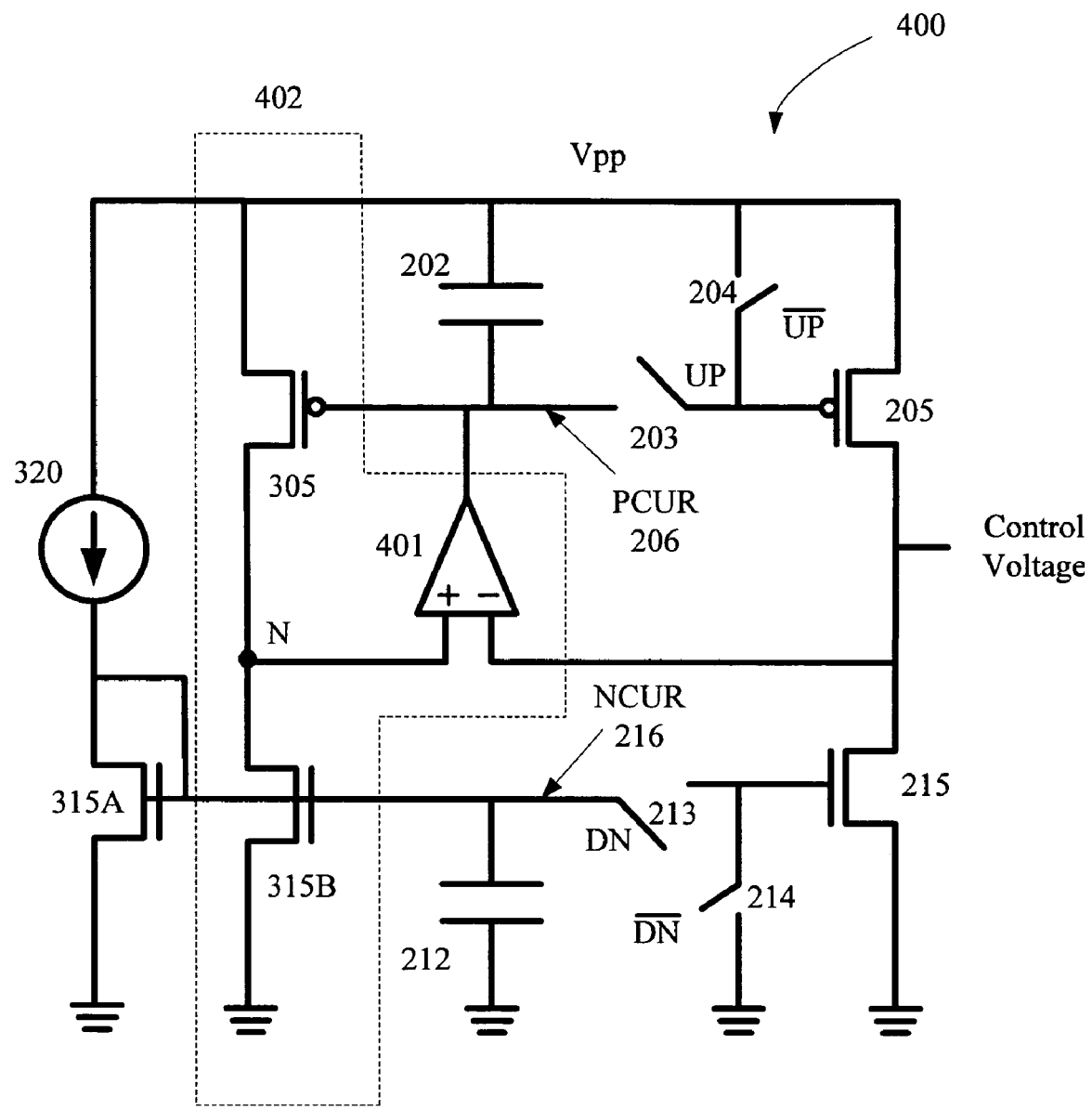
FIG. 4 illustrates yet another exemplary charge pump using NMOS and PMOS transistors for current sources and capacitors for providing a rapid turn on voltage to the transistors. A replica bias circuit can be used in this charge pump to more closely match the currents provided by the current sources.

FIG. 4 illustrates an exemplary charge pump 400 that includes the current mirrors of FIG. 3 as well as an operational amplifier 401. In this embodiment, operational amplifier 401 has a positive input terminal connected to the drains of transistors 305/315B and a negative input terminal connected to the drains of transistors 205/215. The output terminal is connected to control line 206.

In this configuration, the voltage on control line 216 can be set by transistor 315A (which is diode-connected), while the voltage on control line 206 can be set by a replica bias circuit 402 including transistors 305, 315B, and operational amplifier 401. Specifically, operational amplifier 401 can set the voltage on control line 206, such that node N is at the same potential as the control voltage. In this manner, operational amplifier 401 can advantageously compensate for the channel length modulation effect caused by the increase of the depletion layer width at the drain as the drain voltage is increased (in, for example, an NMOS device), leading to a shorter channel length and an increased drain current, as well as for extreme high/low control voltages (i.e. substantially rail-to-rail voltages). Thus, charge pump 400 can function equally well when the control voltage is close to the high or low supply voltage and the transistors 205 or 215 are in the triode (i.e. linear) region. The control voltage range is limited by the acceptable range of input voltages of operational amplifier 401.

In one embodiment, the size of the mirrored transistors in different branches (e.g. transistors 205 and 305 can be the same size). In other embodiments, the size of the mirrored transistors can be proportional. For example, transistor 305 could be ½ the width of transistor 205 and bias current source 320 operated at one-half the value of the charge current sourced by transistor 205.

Figure 5:
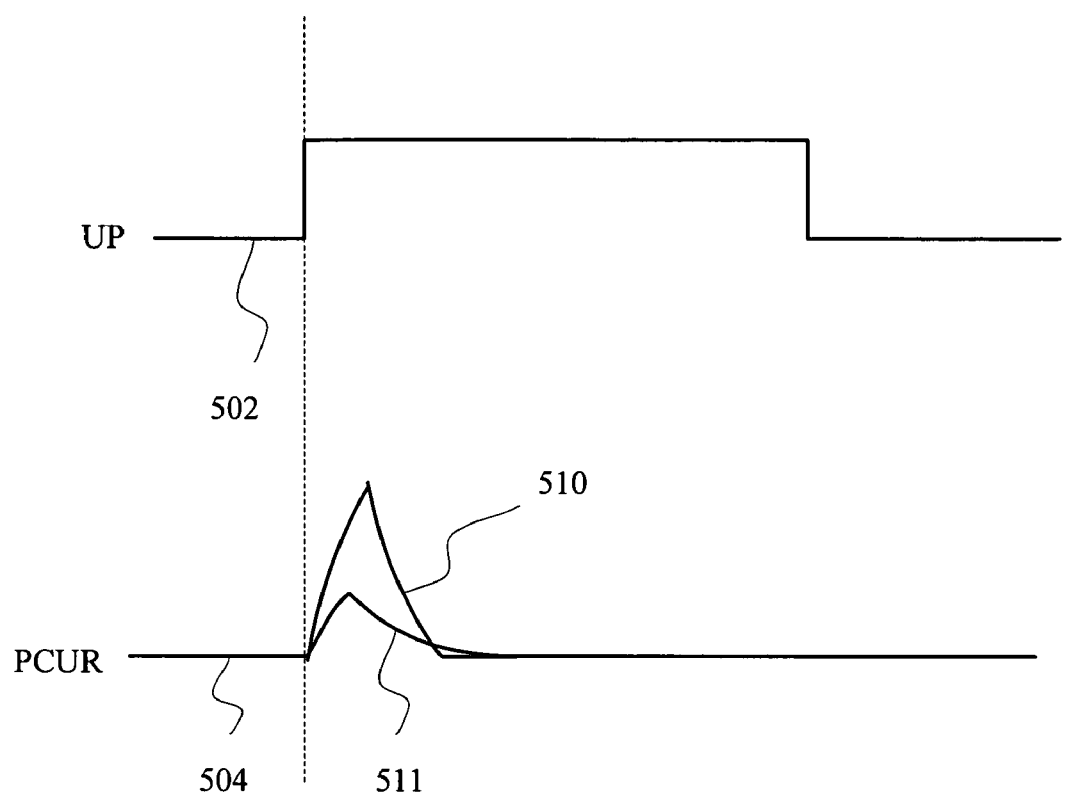
FIG. 5 illustrates the relation of the rising edge of the logic signal UP and the voltage on the control line for two different sizes of bypass capacitor.

FIG. 5 illustrates the relation between the voltage of logic signal UP 502 and PCUR 504, representing the voltage present on control line 206. Curve 510 represents the voltage impulse for a small value of bypass capacitor 202 and curve 511 represents the voltage impulse for a large value of bypass capacitor 202. A similar but opposite in polarity case would obtain for logic signal DN and the voltage on control line 216 (not shown).

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, in other embodiments, cascode devices could be used to provide current mirroring. Accordingly, it is intended that the scope of the invention be defined by the following Claims and their equivalents.

The invention claimed is:

1. A charge pump including a first current source and a second current source connected in series between a high voltage source and a low voltage source, the charge pump comprising:
   a PMOS transistor functioning as the first current source, a source of the PMOS transistor being connected to the high voltage source and a gate of the PMOS transistor being selectively connected to the high voltage source;
   a first capacitor connected to the high voltage source and selectively connected to a gate of the PMOS transistor;
   a first bias generator for charging the first capacitor;
   an NMOS transistor functioning as the second current source, a source of the NMOS transistor being connected to the low voltage source, and a drain of the NMOS transistor being connected to a drain of the PMOS transistor, and a gate of the NMOS transistor being selectively connected to the low voltage source;
   a second capacitor connected to the low voltage source and selectively connected to a gate of the NMOS transistor; and
   a second bias generator for charging the second capacitor, wherein the first and second bias generators include a current mirror circuit, wherein the current mirror circuit includes:
      a mirrored PMOS transistor having a source connected to the high voltage source and a gate connected to its drain and to the first capacitor;
      a first mirrored NMOS transistor having a source connected to the low voltage source and a gate connected to the second capacitor;
      a second mirrored NMOS transistor having a source connected to the low voltage source and a gate connected to the gate of the first mirrored NMOS transistor; and
      a bias current source connected between the high voltage source and a drain of the second mirrored NMOS transistor,
      wherein the gate and drain of the second mirrored NMOS transistor are connected, and wherein the drains of the mirrored PMOS transistor and the first mirrored NMOS transistor are connected.

2. The charge pump of claim 1, further including an operational amplifier having a positive input terminal connected to the drains of the mirrored PMOS transistor and the first mirrored NMOS transistor, a negative input terminal connected to the drains of the PMOS transistor and the NMOS transistor, and an output terminal connected to the first capacitor.

3. A charge pump including a first current source and a second current source connected in series between a high voltage source and a low voltage source, the charge pump comprising:
   a PMOS transistor functioning as the first current source, a source of the PMOS transistor being connected to the high voltage source and a gate of the PMOS transistor being selectively connected to the high voltage source;
   a first capacitor connected to the high voltage source and selectively connected to a gate of the PMOS transistor;
   a first bias generator for charging the first capacitor;
   an NMOS transistor functioning as the second current source, a source of the NMOS transistor being connected to the low voltage source, a drain of the NMOS transistor being connected to a drain of the PMOS transistor, and a gate of the NMOS transistor being selectively connected to the low voltage source;
   a second capacitor connected to the low voltage source and selectively connected to a gate of the NMOS transistor; and
   a second bias generator for charging the second capacitor, wherein the first and second bias generators include a current mirror circuit, wherein the current mirror circuit includes:
      a PMOS bias transistor having a source connected to the high voltage source and a gate connected to the first capacitor;
      a first mirrored NMOS transistor having a source connected to the low voltage source and a gate connected to the second capacitor;
      a second mirrored NMOS transistor having a source connected to the low voltage source and a gate connected to the gate of the first mirrored NMOS transistor; and
      an operational amplifier having a positive input terminal connected to the drains of the PMOS bias transistor and the first mirrored NMOS transistor, a negative input terminal connected to the drains of the PMOS bias transistor and the NMOS transistor, and an output terminal connected to the first capacitor and the gate of the PMOS bias transistor; and
      a bias current source connected between the high voltage source and a drain of the second mirrored NMOS transistor,
      wherein the gate and drain of the second mirrored NMOS transistor are connected, and wherein the drains of the PMOS bias transistor and the first mirrored NMOS transistor are connected.

4. A charge pump including a first current source and a second current source connected in series between a high voltage source and a low voltage source, the charge pump comprising:
   a PMOS transistor functioning as the first current source;
   an NMOS transistor functioning as the second current source;

capacitive circuits for turning on the PMOS transistor and the NMOS transistor;

switches for turning off the PMOS transistor and the NMOS transistor;

a current mirror in operative relation to the PMOS transistor and the NMOS transistor, the current mirror for matching currents of the PMOS transistor and the NMOS transistor; and an operational amplifier in operative relation to the current mirror, the PMOS transistor, and the NMOS transistor, wherein the operational amplifier can adjust the current of the PMOS transistor.

5. A method of designing a charge pump, the method comprising:

connecting a source of a PMOS transistor to a high voltage source and selectively connecting a gate of the PMOS transistor to the high voltage source;

connecting a first capacitor to the high voltage source;

selectively connecting the first capacitor to a gate of the PMOS transistor;

providing a first bias generator for charging the first capacitor;

connecting a source of an NMOS transistor to a low voltage source and selectively connecting a gate of the NMOS transistor to the low voltage source;

connecting a drain of the NMOS transistor to a drain of the PMOS transistor;

connecting a second capacitor to the low voltage source;

selectively connecting the second capacitor to a gate of the NMOS transistor;

providing a second bias generator for charging the second capacitor;

implementing the first and second bias generators with a current mirror circuit, wherein the PMOS and NMOS transistors function as current sources, and wherein the first and second capacitors function to rapidly turn on the PMOS and NMOS transistors, wherein the current mirror circuit includes a mirrored PMOS transistor, a first mirrored NMOS transistor, a second mirrored NMOS transistor, and a bias current source, wherein the method further includes:

connecting a source of the mirrored PMOS transistor to the high voltage source;

connecting a gate of the mirrored PMOS transistor to the first capacitor and to the drain the mirrored PMOS transistor;

connecting a source of the first mirrored NMOS transistor to the low voltage source;

connecting a gate of the first mirrored NMOS transistor to the second capacitor;

connecting a source of the second mirrored NMOS transistor to the low voltage source;

connecting a gate of the second mirrored NMOS transistor to the gate of the first mirrored NMOS transistor;

connecting a bias current source between the high voltage source and a drain of the second mirrored NMOS transistor;

connecting the gate and drain of the second mirrored NMOS transistor; and connecting the drains of the mirrored PMOS transistor and the first mirrored NMOS transistor.

6. A method of designing a charge pump, the method comprising:

connecting a source of a PMOS transistor to a high voltage source and selectively connecting a gate of the PMOS transistor to the high voltage source;

connecting a first capacitor to the high voltage source;

selectively connecting the first capacitor to a gate of the PMOS transistor;

providing a first bias generator for charging the first capacitor;

connecting a source of an NMOS transistor to a low voltage source and selectively connecting a gate of the NMOS transistor to the low voltage source;

connecting a drain of the NMOS transistor to a drain of the PMOS transistor;

connecting a second capacitor to the low voltage source;

selectively connecting the second capacitor to a gate of the NMOS transistor;

providing a second bias generator for charging the second capacitor;

implementing the first and second bias generators with a current mirror circuit, wherein the PMOS and NMOS transistors function as current sources, and wherein the first and second capacitors function to rapidly turn on the PMOS and NMOS transistors, wherein the current mirror circuit includes a PMOS bias transistor, a first mirrored NMOS transistor, a second mirrored NMOS transistor, an operational amplifier and a bias current source, wherein the method further includes:

connecting a source of the PMOS bias transistor to the high voltage source;

connecting a gate of the PMOS bias transistor to the first capacitor;

connecting a source of the first mirrored NMOS transistor to the low voltage source;

connecting a gate of the first mirrored NMOS transistor to the second capacitor;

connecting a source of the second mirrored NMOS transistor to the low voltage source;

connecting a gate of the second mirrored NMOS transistor to the gate of the first mirrored NMOS transistor;

connecting a bias current source between the high voltage source and a drain of the second mirrored NMOS transistor;

connecting the gate and drain of the second mirrored NMOS transistor; and connecting the drains of the PMOS bias transistor and the first mirrored NMOS transistor; and connecting the positive input terminal of the operational amplifier to the drains of the PMOS bias transistor and the first mirrored NMOS transistor; and connecting a negative input terminal of the operational amplifier to the drains of the PMOS transistor and the NMOS transistor; and connecting an output terminal of the operational amplifier to the first capacitor.

* * * * *